United States Patent
Tenno et al.

(10) Patent No.: US 12,112,867 B2
(45) Date of Patent: Oct. 8, 2024

(54) MULTILAYERED SUBSTRATE

(71) Applicant: Murata Manufacturing Co., Ltd., Nagaokakyo (JP)

(72) Inventors: Nobuyuki Tenno, Nagaokakyo (JP); Nobuo Ikemoto, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 299 days.

(21) Appl. No.: 17/495,850

(22) Filed: Oct. 7, 2021

(65) Prior Publication Data

US 2022/0028578 A1    Jan. 27, 2022

Related U.S. Application Data

(63) Continuation of application No. PCT/JP2020/025317, filed on Jun. 26, 2020.

(30) Foreign Application Priority Data

Jul. 10, 2019 (JP) ................................ 2019-128609

(51) Int. Cl.
*H01B 7/08* (2006.01)
*H01B 11/20* (2006.01)

(52) U.S. Cl.
CPC ......... *H01B 7/0838* (2013.01); *H01B 11/203* (2013.01)

(58) Field of Classification Search
CPC ..................................................... H01B 7/08
See application file for complete search history.

(56) References Cited

U.S. PATENT DOCUMENTS

| | | | | |
|---|---|---|---|---|
| 5,885,710 | A * | 3/1999 | MacDonald, Jr. ...... | H01P 3/085 428/375 |
| 7,807,927 | B2 * | 10/2010 | Yeh ...................... | H01B 7/0838 174/117 FF |
| 8,045,297 | B2 * | 10/2011 | Contreras .............. | G11B 5/486 360/245.9 |

(Continued)

FOREIGN PATENT DOCUMENTS

| JP | 05-291806 A | 11/1993 |
|---|---|---|
| JP | 2001-144452 A | 5/2001 |
| WO | 2016/047540 A1 | 3/2016 |

OTHER PUBLICATIONS

Official Communication issued in International Patent Application No. PCT/JP2020/025317, mailed on Sep. 15, 2020.

*Primary Examiner* — Chau N Nguyen
(74) *Attorney, Agent, or Firm* — Keating & Bennett, LLP (57) ABSTRACT

A multilayered substrate includes first, second, and third insulating layers, and a transmission line. The first insulating layer includes first and second surfaces opposite to each other. A signal conductor of the transmission line is on the first surface of the first insulating layer. The second insulating layer is in contact with the first surface of the first insulating layer. The third insulating layer is in contact with the second surface of the first insulating layer. A dielectric loss of the second insulating layer is lower than a dielectric loss of the third insulating layer. A degree of close contact between the first insulating layer and the third insulating layer is higher than a degree of close contact between the first insulating layer and the second insulating layer.

12 Claims, 5 Drawing Sheets

(56) References Cited

U.S. PATENT DOCUMENTS

2009/0211792 A1* 8/2009 Abrahamson ........ H05K 3/4688
  29/830
2017/0187087 A1  6/2017 Baba et al.
2019/0215947 A1* 7/2019 Du .......................... H05K 1/09

* cited by examiner

MULTILAYERED SUBSTRATE

CROSS REFERENCE TO RELATED APPLICATIONS

This application claims the benefit of priority to Japanese Patent Application No. 2019-128609 filed on Jul. 10, 2019 and is a Continuation Application of PCT Application No. PCT/JP2020/025317 filed on Jun. 26, 2020. The entire contents of each application are hereby incorporated herein by reference.

BACKGROUND OF THE INVENTION

1. Field of the Invention

The present invention relates to a multilayered substrate including a transmission line through which a high-frequency signal is transmitted.

2. Description of the Related Art

Multilayered substrates that include a plurality of laminated insulating layers including an insulating layer in which a conductive pattern is formed have been used as, for example, transmission lines through which high-frequency signals are transmitted.

For example, in International Publication No. 2016/047540, a multilayered substrate that includes a plurality of laminated insulating layers including an insulating layer in which a signal conductor is formed and an insulating layer in which a ground conductor is formed is described.

Electrical characteristics of a transmission line and an appropriate mechanical and structural strength are required for the multilayered substrate including a plurality of laminated insulating layers described in International Publication No. 2016/047540. For example, an insulating layer that ensures low-loss characteristics and obtains a specific characteristic impedance is required as an insulating layer that defines a transmission line. Meanwhile, in terms of the mechanical and structural strength, a high degree of close contact is desired between insulating layers that are adjacent to each other in a lamination direction.

However, materials for insulating layers that satisfy high-frequency characteristics required for a transmission line and satisfy a desired degree of close contact between insulating layers are limited. Both the high-frequency characteristics of a transmission line in a multilayered substrate and mechanical and structural strength of the multilayered substrate cannot be obtained at the same time. Thus, one of the high-frequency characteristics and the mechanical and structural strength has been sacrificed or a compromised design has been used.

SUMMARY OF THE INVENTION

Preferred embodiments of the present invention provide multilayered substrates that each achieve both high-frequency characteristics of a transmission line and mechanical and structural strength.

A multilayered substrate according to a preferred embodiment of the present invention includes a plurality of laminated insulating layers including a first insulating layer, a second insulating layer, and a third insulating layer, and a transmission line in the multilayered substrate. The first insulating layer includes a first surface and a second surface that are opposite to each other. A signal conductor of the transmission line is provided on the first surface of the first insulating layer. The second insulating layer is in contact with the first surface of the first insulating layer. The third insulating layer is in contact with the second surface of the first insulating layer. A dielectric loss of the second insulating layer is lower than a dielectric loss of the third insulating layer. A degree of close contact between the first insulating layer and the third insulating layer is higher than a degree of close contact between the first insulating layer and the second insulating layer.

In general, when the multilayered substrate is bent in the lamination direction, a relatively high stress is applied to a position spaced away from the center in the lamination direction. With the configuration described above, the degree of close contact between the first insulating layer and the third insulating layer, which are spaced away from the center in the lamination direction, is high. Thus, the multilayered substrate has a high mechanical and structural resistance to bending. Furthermore, the dielectric loss of the second insulating layer, with which the signal conductor is in contact, is lower than the dielectric loss of the third insulating layer, which is spaced away from the signal conductor. Thus, excellent high-frequency characteristics regarding transmission loss of the transmission line are achieved.

According to preferred embodiments of the present invention, multilayered substrates each with excellent high-frequency characteristics of a transmission line and excellent mechanical and structural strength are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described as examples with reference to drawings. In the drawings, the same or corresponding elements and portions are assigned with the same reference signs. In second and subsequent preferred embodiments, description of matters common to the first preferred embodiment will be omitted, and different points will be described. In particular, the same or similar operational advantages obtained by the same or similar configurations will not be described in the individual preferred embodiments.

First Preferred Embodiment

Figure 1:
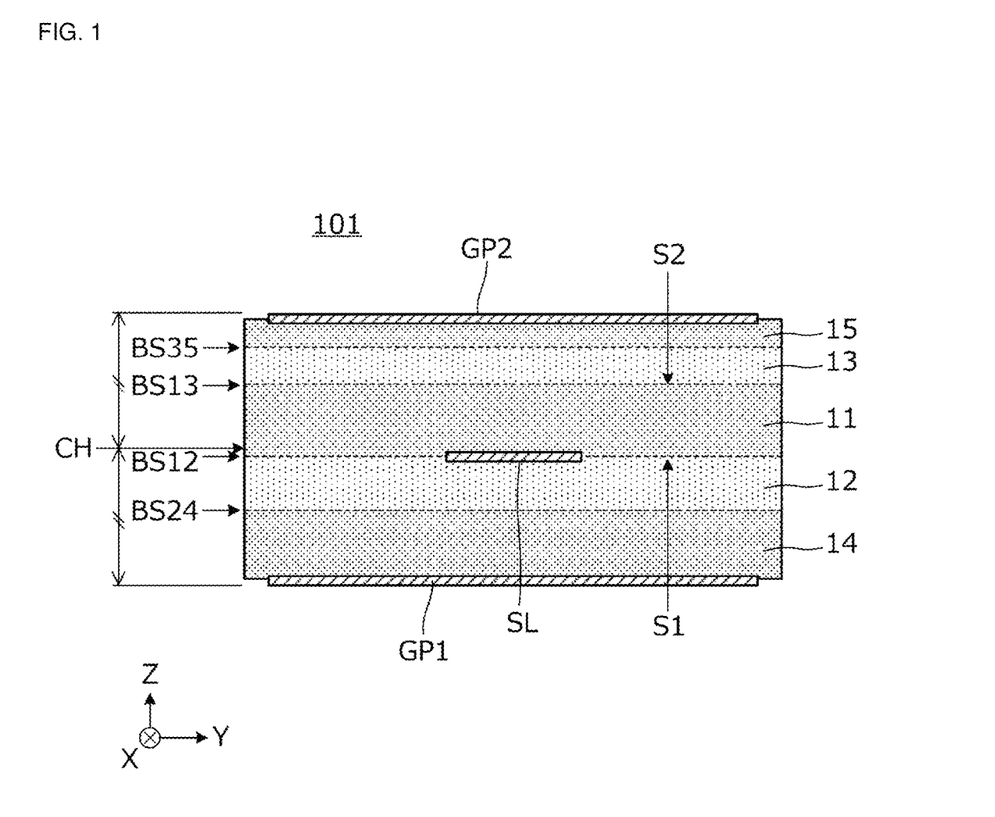
FIG. 1 is a cross-section view of a multilayered substrate 101 according to a first preferred embodiment of the present invention.
Figure 2:
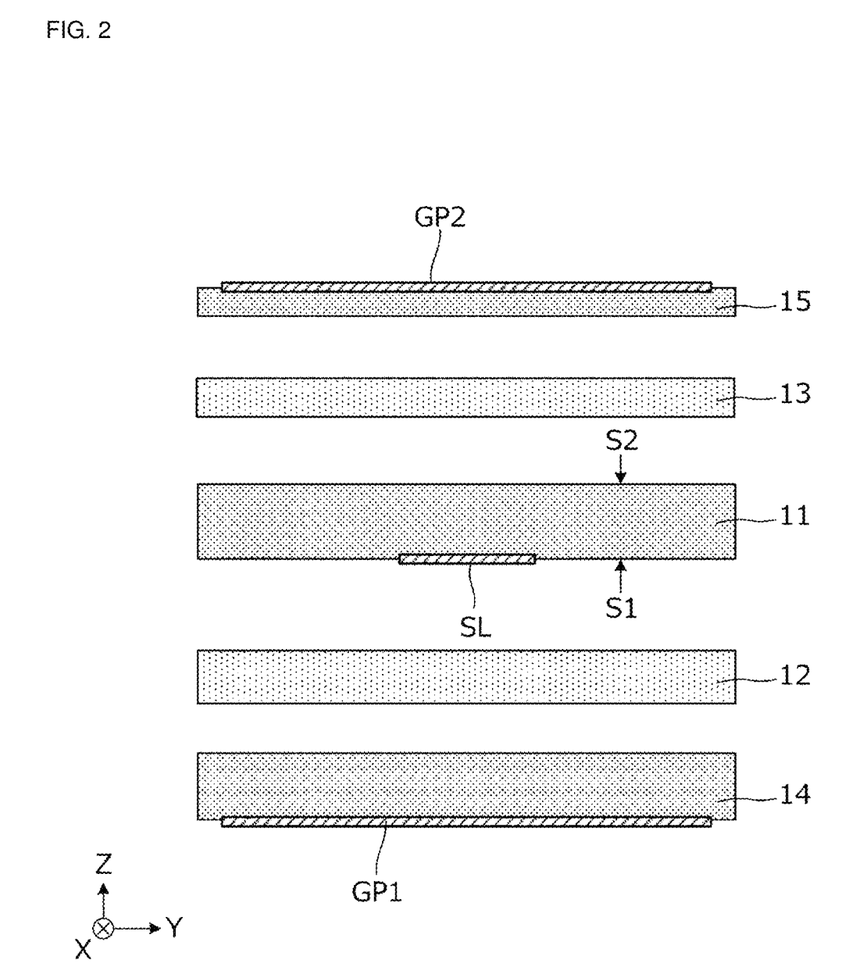
FIG. 2 is a cross-section view of the multilayered substrate 101 in a state before lamination is performed.

FIG. 1 is a cross-section view of a multilayered substrate 101 according to a first preferred embodiment of the present invention. FIG. 2 is a cross-section view of the multilayered substrate 101 in a state before lamination is performed.

The multilayered substrate 101 includes a multilayer body including a first insulating layer 11, a second insulating layer 12, a third insulating layer 13, a fourth insulating layer 14, and a fifth insulating layer 15 that are laminated in a Z-axis direction, a signal conductor SL provided inside the multilayer body, and ground conductors GP1 and GP2 provided on outer surfaces of the multilayer body. A longer direction of the multilayered substrate 101 is represented by an X-axis direction, and a shorter direction of the multilayered substrate 101 is represented by a Y-axis direction. The signal conductor SL extends in the X-axis direction. The signal conductor SL, the ground conductors GP1 and GP2, and the insulating layers 11 to 15 between the ground conductors GP1 and GP2 define a stripline transmission line. Thus, the first insulating layer 11 is located between the signal conductor SL and the ground conductor GP2 (second ground conductor) in the Z-axis direction (lamination direction). The second insulating layer 12 is located between the signal conductor SL and the ground conductor GP1 (first ground conductor) in the Z-axis direction (lamination direction).

The first insulating layer 11, the fourth insulating layer 14, and the fifth insulating layer 15 are resin layers made of, for example, polyimide (PI), modified-polyphenylene ether (PPE), liquid crystal polymer (LCP), or the like. The second insulating layer 12 and the third insulating layer 13 are bonding material layers. The second insulating layer 12 is, for example, a fluorine resin layer. The third insulating layer 13 is, for example, a prepreg layer made of polyimide (PI), liquid crystal polymer (LCP), or the like.

The first insulating layer 11 includes a first surface S1 and a second surface S2 that are opposite to each other. The signal conductor SL is provided on the first surface S1 of the first insulating layer 11. The ground conductor GP1 is provided on a bottom surface of the fourth insulating layer 14, and the ground conductor GP2 is provided on the top surface of the fifth insulating layer 15. The second insulating layer 12 is in contact with the first surface S1 of the first insulating layer 11, and the third insulating layer 13 is in contact with the second surface S2 of the first insulating layer 11.

In FIG. 1, CH represents a center height position of the multilayered substrate 101 in the lamination direction. As is clear from the center height position CH, the first insulating layer 11 is located closer to the center of the multilayered substrate 101 in the lamination direction than is the third insulating layer 13. A boundary surface BS12 between the first insulating layer 11 and the second insulating layer 12 is located closer to the center in the lamination direction than is a boundary surface BS13 between the first insulating layer 11 and the third insulating layer 13. The degree of close contact between the first insulating layer 11 and the third insulating layer 13 is higher than the degree of close contact between the first insulating layer 11 and the second insulating layer 12. "A degree of close contact" means a peel strength resulting from performing a peel test at a predetermined layer interface of the multilayer substrate. With this structure, the multilayered substrate 101 has a high mechanical and structural resistance to bending, as described below.

Figure 3:
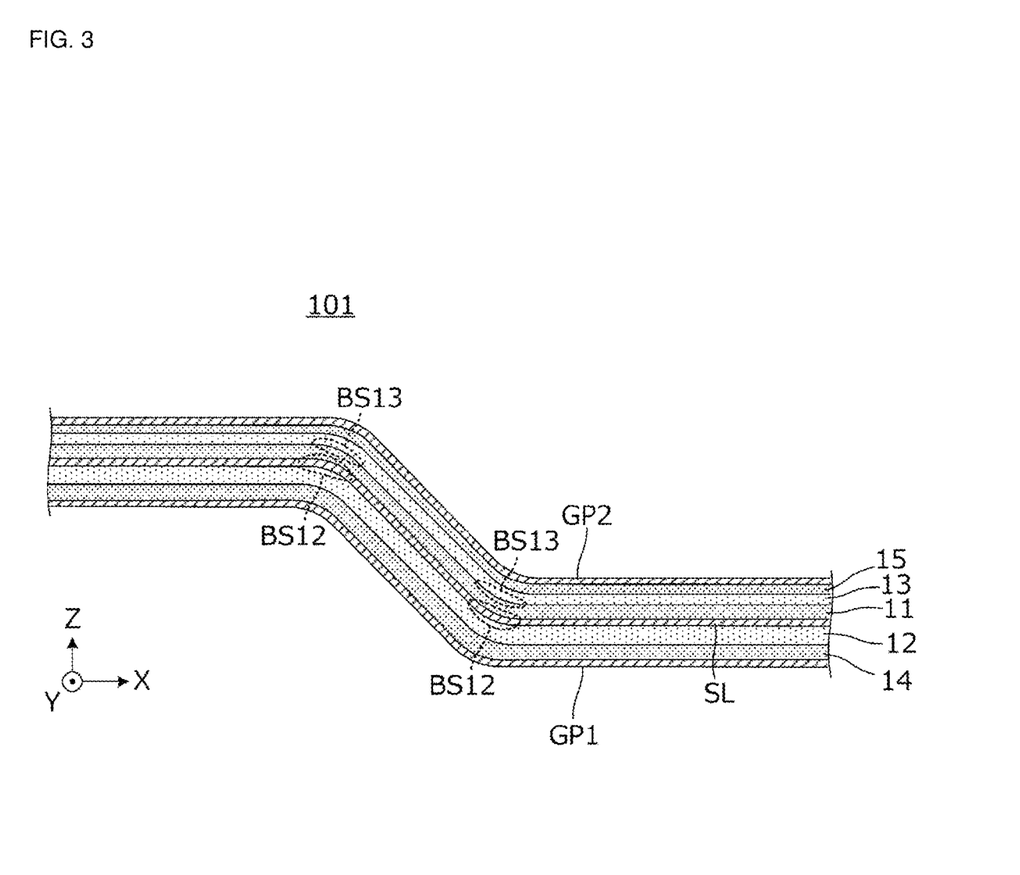
FIG. 3 is a cross-section view of the multilayered substrate 101 taken along a plane along a signal conductor SL when the multilayered substrate 101 is bent in a lamination direction.

FIG. 3 is a cross-section view of the multilayered substrate 101 taken along a plane along the signal conductor SL when the multilayered substrate 101 is bent in the lamination direction. As illustrated in FIG. 3, when the multilayered substrate 101 is bent in the lamination direction, in a bent portion, the stress applied to the boundary surface BS13 between the first insulating layer 11 and the third insulating layer 13 is higher than the stress applied to the boundary surface BS12 between the first insulating layer 11 and the second insulating layer 12. This is because the boundary surface BS13 is located farther away from the center in the lamination direction of the plurality of insulating layers than is the boundary surface BS12. The degree of close contact between the first insulating layer 11 and the third insulating layer 13, between which a high stress is applied, is high. Thus, the multilayered substrate 101 has a high mechanical and structural resistance to bending.

Furthermore, in the multilayered substrate 101 according to the present preferred embodiment, the Young's modulus of the third insulating layer 13 is lower than the Young's modulus of the second insulating layer 12. That is, the third insulating layer 13 is softer than the second insulating layer 12.

As illustrated in FIG. 3, when the multilayered substrate 101 is bent in the lamination direction, the stress applied to the third insulating layer 13 is higher than the stress applied to the second insulating layer 12. This is because the third insulating layer 13 is located farther away from the center in the lamination direction of the plurality of insulating layers than is the second insulating layer 12. As described above, the third insulating layer 13, to which a high stress is applied, is soft. Thus, the multilayered substrate 101 has a high mechanical and structural resistance to bending.

Furthermore, in the multilayered substrate 101 according to the present preferred embodiment, a boundary surface BS24 between the second insulating layer 12 and the fourth insulating layer 14 is located closer to the center in the lamination direction than is a boundary surface BS35 between the third insulating layer 13 and the fifth insulating layer 15, and the degree of close contact between the third insulating layer 13 and the fifth insulating layer 15 is higher than the degree of close contact between the second insulating layer 12 and the fourth insulating layer 14. When the multilayered substrate 101 is bent in the lamination direction, the stress applied to the boundary surface BS35 is higher than the stress applied to the boundary surface BS24. However, the degree of close contact of the boundary surface BS35, to which a high stress is applied, is high. Thus, the multilayered substrate 101 has a high mechanical and structural resistance to bending.

Furthermore, in the multilayered substrate 101 according to the present preferred embodiment, the boundary surface BS13 between the first insulating layer 11 and the third insulating layer 13 is located closer to the center in the lamination direction than is the boundary surface BS24 between the second insulating layer 12 and the fourth insulating layer 14, and the degree of close contact between the first insulating layer 11 and the third insulating layer 13 is higher than the degree of close contact between the second insulating layer 12 and the fourth insulating layer 14. When the multilayered substrate 101 is bent in the lamination direction, the stress applied to the boundary surface BS13 is higher than the stress applied to the boundary surface BS24. However, the degree of close contact of the boundary surface BS13, to which a high stress is applied, is high.

Thus, the multilayered substrate 101 has a high mechanical and structural resistance to bending.

Furthermore, in the multilayered substrate 101 according to the present preferred embodiment, the dielectric loss of the second insulating layer 12 is lower than the dielectric loss of the third insulating layer 13. The dielectric loss of a dielectric is represented by εr tanδ, which is the product of a relative dielectric constant εr and a dielectric loss tangent tan δ. Thus, the dielectric loss of an insulating layer decreases as the relative dielectric constant εr decreases and the dielectric loss tangent tan δ decreases. For example, the relative dielectric constant and the dielectric loss tangent of the second insulating layer 12, which is made of, for example, fluorine resin, are about 2.1 and about 0.001, respectively. The relative dielectric constant and the dielectric loss tangent of the third insulating layer 13, which is made of, for example, polyimide prepreg, are about 3.2 and about 0.003, respectively. As described above, by causing the dielectric loss of the second insulating layer 12, which is in contact with the signal conductor SL, to be lower than the dielectric loss of the third insulating layer 13, which is spaced away from the signal conductor SL, loss on a high-frequency signal in the transmission line defined by the signal conductor SL, the ground conductors GP1 and GP2, and the insulating layers 11 to 15 between the ground conductors GP1 and GP2 can be reduced.

Second Preferred Embodiment

In a second preferred embodiment of the present invention, an example of a multilayered substrate including a plurality of signal conductors will be described.

Figure 4:
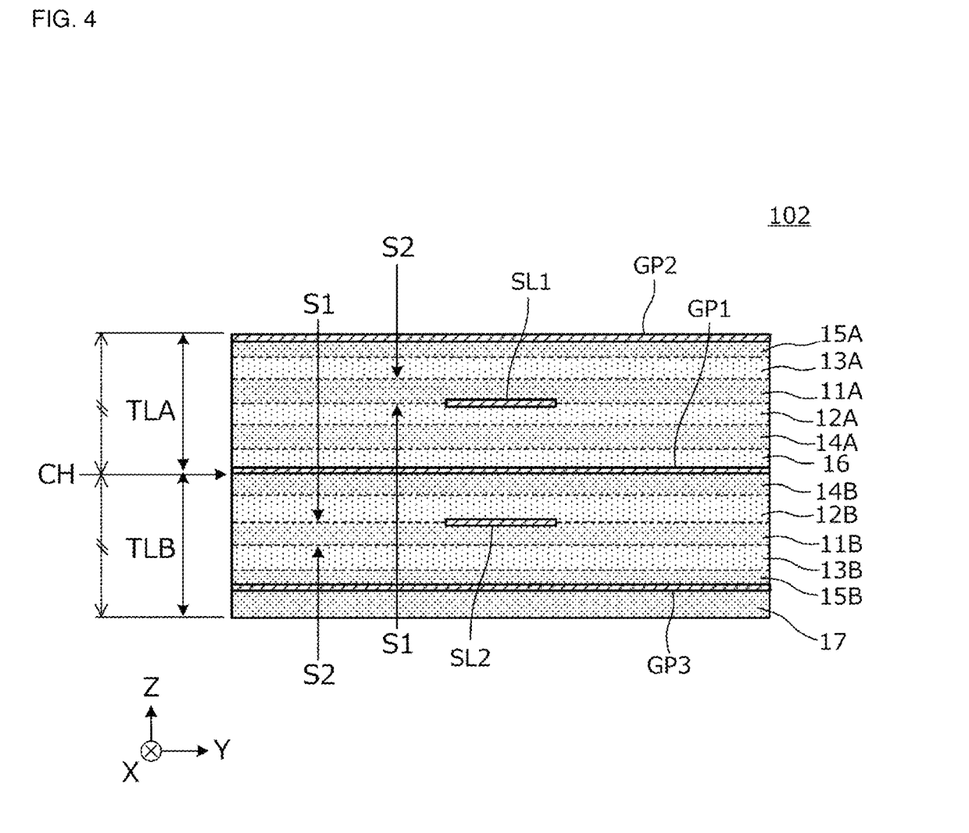
FIG. 4 is a cross-section view of a multilayered substrate 102 according to a second preferred embodiment of the present invention.

FIG. 4 is a cross-section view of a multilayered substrate 102 according to the second preferred embodiment. A longer direction of the multilayered substrate 102 is represented by an X-axis direction, and a shorter direction of the multilayered substrate 102 is represented by a Y-axis direction. Signal conductors SL1 and SL2 extend in the X-axis direction. The multilayered substrate 102 includes stripline transmission lines TLA and TLB. The transmission line TLA includes a first insulating layer 11A, a second insulating layer 12A, a third insulating layer 13A, a fourth insulating layer 14A, a fifth insulating layer 15A, a sixth insulating layer 16, the signal conductor SL1, and ground conductors GP1 and GP2. The transmission line TLB includes a first insulating layer 11B, a second insulating layer 12B, a third insulating layer 13B, a fourth insulating layer 14B, a fifth insulating layer 15B, a seventh insulating layer 17, the signal conductor SL2, and ground conductors GP1 and GP3.

All of the second insulating layers 12A and 12B, the third insulating layers 13A and 13B, and the sixth insulating layer 16 are bonding material layers.

The first insulating layer 11A includes a first surface S1 and a second surface S2 that are opposite to each other, and the signal conductor SL1 is provided on the first surface S1 of the first insulating layer 11A. The ground conductor GP2 is provided on a top surface of the fifth insulating layer 15A.

The first insulating layer 11B includes a first surface S1 and a second surface S2 that are opposite to each other, and the signal conductor SL2 is provided on the first surface S1 of the first insulating layer 11B. The ground conductor GP1 is provided on a top surface of the fourth insulating layer 14B, and the ground conductor GP3 is provided on a bottom surface of the fifth insulating layer 15B or on a top surface of the seventh insulating layer 17.

In FIG. 4, CH represents a center height position of the multilayered substrate 102 in the lamination direction. As is clear from FIG. 4, in the multilayered substrate 102 according to the present preferred embodiment, a boundary surface between the first insulating layer 11A and the second insulating layer 12A is located closer to the center in the lamination direction than is a boundary surface between the first insulating layer 11A and the third insulating layer 13A. Thus, when the multilayered substrate 102 is bent in the lamination direction, the stress applied to the boundary surface between the first insulating layer 11A and the third insulating layer 13A is higher than the stress applied to the boundary surface between the first insulating layer 11A and the second insulating layer 12A. However, the degree of close contact between the first insulating layer 11A and the third insulating layer 13A, between which a high stress is applied, is high. Thus, the multilayered substrate 102 has a high mechanical and structural resistance to bending.

In a similar manner, a boundary surface between the first insulating layer 11B and the second insulating layer 12B is located closer to the center in the lamination direction than is a boundary surface between the first insulating layer 11B and the third insulating layer 13B. Thus, when the multilayered substrate 102 is bent in the lamination direction, the stress applied to the boundary surface between the first insulating layer 11B and the third insulating layer 13B is higher than the stress applied to the boundary surface between the first insulating layer 11B and the second insulating layer 12B. However, the degree of close contact between the first insulating layer 11B and the third insulating layer 13B, between which a high stress is applied, is high. Thus, the multilayered substrate 102 has a high mechanical and structural resistance to bending.

Furthermore, in the multilayered substrate 102 according to the present preferred embodiment, the Young's modulus of the third insulating layer 13A is lower than the Young's modulus of the second insulating layer 12A. When the multilayered substrate 102 is bent in the lamination direction, the stress applied to the third insulating layer 13A is higher than the stress applied to the second insulating layer 12A. This is because the third insulating layer 13A is spaced farther away from the center in the lamination direction of the plurality of insulating layers than is the second insulating layer 12A. The third insulating layer 13A, to which a high stress is applied, is soft. Thus, the multilayered substrate 102 has a high mechanical and structural resistance to bending.

In a similar manner, the Young's modulus of the third insulating layer 13B is lower than the Young's modulus of the second insulating layer 12B. When the multilayered substrate 102 is bent in the lamination direction, the stress applied to the third insulating layer 13B is higher than the stress applied to the second insulating layer 12B. This is because the third insulating layer 13B is spaced farther away from the center in the lamination direction of the plurality of insulating layers than is the second insulating layer 12B. The third insulating layer 13B, to which a high stress is applied, is soft. Thus, the multilayered substrate 102 has a high mechanical and structural resistance to bending.

Furthermore, in the multilayered substrate 102 according to the present preferred embodiment, a boundary surface between the second insulating layer 12A and the fourth insulating layer 14A is located closer to the center in the lamination direction than is a boundary surface between the third insulating layer 13A and the fifth insulating layer 15A, and the degree of close contact between the third insulating layer 13A and the fifth insulating layer 15A is higher than the degree of close contact between the second insulating layer 12A and the fourth insulating layer 14A. When the multilayered substrate 102 is bent in the lamination direction, the stress applied to the boundary surface between the third insulating layer 13A and the fifth insulating layer 15A is higher than the stress applied to the boundary surface between the second insulating layer 12A and the fourth insulating layer 14A. However, the degree of close contact of the boundary surface to which a high stress is applied is high. Thus, the multilayered substrate 102 has a high mechanical and structural resistance to bending.

In a similar manner, a boundary surface between the second insulating layer 12B and the fourth insulating layer 14B is located closer to the center in the lamination direction than is a boundary surface between the third insulating layer 13B and the fifth insulating layer 15B, and the degree of close contact between the third insulating layer 13B and the fifth insulating layer 15B is higher than the degree of close contact between the second insulating layer 12B and the fourth insulating layer 14B. When the multilayered substrate 102 is bent in the lamination direction, the stress applied to the boundary surface between the third insulating layer 13B and the fifth insulating layer 15B is higher than the stress applied to the boundary surface between the second insulating layer 12B and the fourth insulating layer 14B. However, the degree of close contact of the boundary surface to which a high stress is applied is high. Thus, the multilayered substrate 102 has a high mechanical and structural resistance to bending.

Furthermore, in the multilayered substrate 102 according to the present preferred embodiment, the boundary surface between the first insulating layer 11A and the third insulating layer 13A is located closer to the center in the lamination direction than is the boundary surface between the second insulating layer 12A and the fourth insulating layer 14A, and the degree of close contact between the first insulating layer 11A and the third insulating layer 13A is higher than the degree of close contact between the second insulating layer 12A and the fourth insulating layer 14A. When the multilayered substrate 102 is bent in the lamination direction, the stress applied to the boundary surface between the first insulating layer 11A and the third insulating layer 13A is higher than the stress applied to the boundary surface between the second insulating layer 12A and the fourth insulating layer 14A. However, the degree of close contact of the boundary surface to which a high stress is applied is high. Thus, the multilayered substrate 102 has a high mechanical and structural resistance to bending.

In a similar manner, the boundary surface between the first insulating layer 11B and the third insulating layer 13B is located closer to the center in the lamination direction than is the boundary surface between the second insulating layer 12B and the fourth insulating layer 14B, and the degree of close contact between the first insulating layer 11B and the third insulating layer 13B is higher than the degree of close contact between the second insulating layer 12B and the fourth insulating layer 14B. When the multilayered substrate 102 is bent in the lamination direction, the stress applied to the boundary surface between the first insulating layer 11B and the third insulating layer 13B is higher than the stress applied to the boundary surface between the second insulating layer 12B and the fourth insulating layer 14B. However, the degree of close contact of the boundary surface to which a high stress is applied is high. Thus, the multilayered substrate 102 has a high mechanical and structural resistance to bending.

Furthermore, in the multilayered substrate 102 according to the present preferred embodiment, the dielectric loss of the second insulating layer 12A is lower than the dielectric loss of the third insulating layer 13A. By causing the dielectric loss of the second insulating layer 12A, which is in contact with the signal conductor SL1, to be lower than the dielectric loss of the third insulating layer 13A, which is spaced away from the signal conductor SL1, loss on a high-frequency signal in the transmission line TLA defined by the signal conductor SL1, the ground conductors GP1 and GP2, and the insulating layers 11A to 15A and 16 between the ground conductors GP1 and GP2 can be reduced.

In a similar manner, the dielectric loss of the second insulating layer 12B is lower than the dielectric loss of the third insulating layer 13B. By causing the dielectric loss of the second insulating layer 12B, which is in contact with the signal conductor SL2, to be lower than the dielectric loss of the third insulating layer 13B, which is located away from the signal conductor SL2, loss on a high-frequency signal in the transmission line TLB defined by the signal conductor SL2, the ground conductors GP1 and GP3, and the insulating layers 11B to 15B and 17 between the ground conductors GP1 and GP3 can be reduced.

In the multilayered substrate 102 according to the present preferred embodiment, the signal conductor SL1 is supported on the bottom surface of the first insulating layer 11A (closer to the center height position CH), and the signal conductor SL2 is supported on the top surface of the first insulating layer 11B (closer to the center height position CH). Accordingly, by arranging the signal conductors SL1 and SL2 to be closer to the center height position CH of the multilayer body, when the multilayered substrate 102 is bent in the lamination direction, the stress applied to the boundary surface of the surfaces of the signal conductor SL1 and the stress applied to the boundary surface of the surfaces of the signal conductor SL2 are low. Thus, separation is less likely to occur at the boundary surfaces of the signal conductors SL1 and SL2, and changes in electrical characteristics caused by interface separation can be reduced.

Third Preferred Embodiment

In a third preferred embodiment of the present invention, an example of a portable electronic apparatus 1 including a multilayered substrate will be described.

Figure 5A:
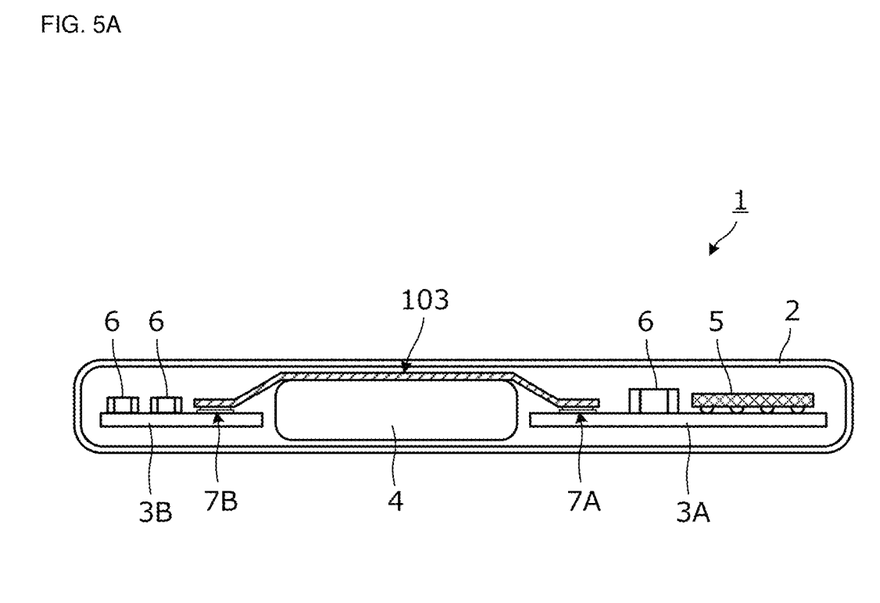
FIG. 5A is a cross-section view of a portable electronic apparatus 1 and illustrates a state in which a multilayered substrate 103 according to a third preferred embodiment of the present invention is mounted.
Figure 5B:
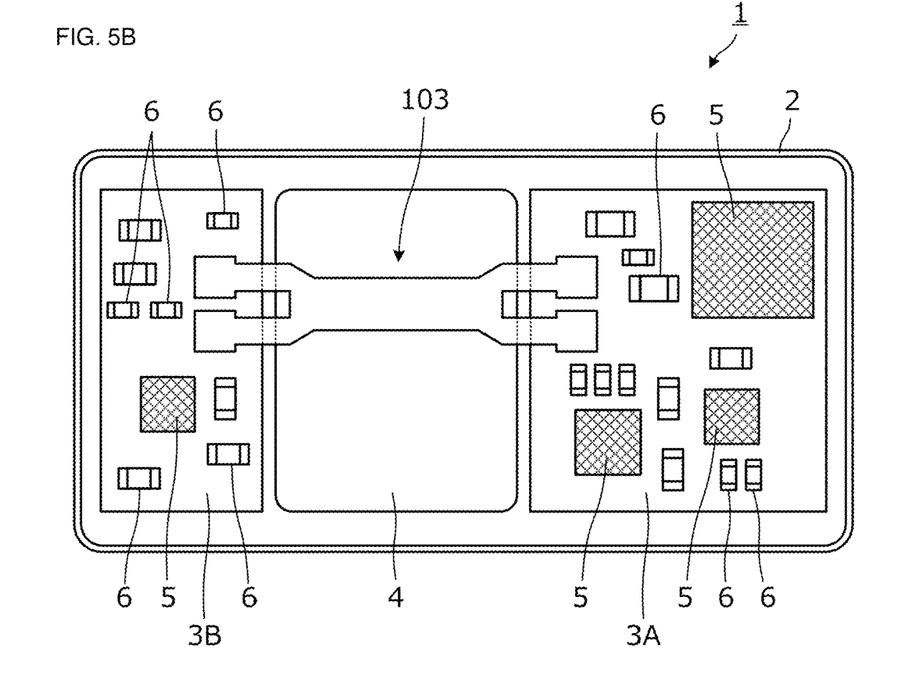
FIG. 5B is a plan view of the inside of the housing of the portable electronic apparatus 1.

FIG. 5A is a cross-section view of the portable electronic apparatus 1 and illustrates a state in which a multilayered substrate 103 according to the third preferred embodiment is mounted, and FIG. 5B is a plan view of the inside of the housing of the portable electronic apparatus 1.

The portable electronic apparatus 1 includes a thin housing 2. Circuit boards 3A and 3B, a battery pack 4, and so on are provided inside the housing 2. A plurality of ICs 5, chip components 6, and so on are mounted on surfaces of the circuit boards 3A and 3B. The circuit boards 3A and 3B and the battery pack 4 are installed in the housing 2 such that the battery pack 4 is between the circuit boards 3A and 3B when the housing 2 is viewed in plan view. The housing 2 is as thin as possible. Thus, the distance between the battery pack 4 and the housing 2 in the direction of the thickness of the housing 2 is very short.

The multilayered substrate 103 according to the present preferred embodiment is used as a flat cable. The cross-section structure of the center of the multilayered substrate 103 is as described in the second preferred embodiment with reference to FIG. 4. That is, the multilayered substrate 103 includes two stripline transmission lines including signal conductors. Connection portions for electrodes 7A and 7B on the circuit boards 3A and 3B are provided at both ends of the multilayered substrate 103 in the longer direction.

The multilayered substrate 103 is inside the housing 2 such that the thickness direction of the multilayered substrate 103 and the thickness direction of the housing 2 are the same or substantially the same and the multilayered substrate 103 is bent in the lamination direction. Accordingly, the circuit boards 3A and 3B that are separated from each other with the battery pack 4 interposed therebetween can be connected to each other via the multilayered substrate 103.

In each of the preferred embodiments described above, a multilayered substrate is illustrated. However, for example, a plurality of multilayered substrates connected as a collective board may be manufactured (by large-size process) and separated into pieces at the end of the process.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayered substrate comprising:
   a plurality of laminated insulating layers including a first insulating layer, a second insulating layer, a third insulating layer, a fourth insulating layer, and a fifth insulating layer; and
   a transmission line; wherein
   the first insulating layer includes a first surface and a second surface that are opposite to each other;
   a signal conductor of the transmission line is provided on the first surface of the first insulating layer;
   the second insulating layer is in contact with the first surface of the first insulating layer;
   the third insulating layer is in contact with the second surface of the first insulating layer;
   a dielectric loss of the second insulating layer is lower than a dielectric loss of the third insulating layer;
   a degree of close contact between the first insulating layer and the third insulating layer is higher than a degree of close contact between the first insulating layer and the second insulating layer;
   a material of each of the first insulating layer, the second insulating layer, and the third insulating layer is different from one another;
   a boundary surface between the first insulating layer and the second insulating layer is closer to a center in a lamination direction than is a boundary surface between the first insulating layer and the third insulating layer;
   the fourth insulating layer is in contact with a surface of the second insulating layer opposite to a surface with which the first insulating layer is in contact;
   the fifth insulating layer is in contact with a surface of the third insulating layer opposite to a surface with which the first insulating layer is in contact;
   a boundary surface between the second insulating layer and the fourth insulating layer is closer to the center in the lamination direction than is a boundary surface between the first insulating layer and the third insulating layer; and
   the degree of close contact between the first insulating layer and the third insulating layer is higher than a degree of close contact between the second insulating layer and the fourth insulating layer.

2. The multilayered substrate according to claim 1, further comprising a bent portion in which the multilayered substrate is bent in a lamination direction.

3. The multilayered substrate according to claim 2, wherein a Young's modulus of the third insulating layer is lower than a Young's modulus of the second insulating layer.

4. The multilayered substrate according to claim 1, wherein
   the boundary surface between the second insulating layer and the fourth insulating layer is closer to the center in the lamination direction than is a boundary surface between the third insulating layer and the fifth insulating layer; and
   a degree of close contact between the third insulating layer and the fifth insulating layer is higher than the degree of close contact between the second insulating layer and the fourth insulating layer.

5. The multilayered substrate according to claim 4, wherein the fourth and fifth insulating layers are made of polyimide, modified-polyphenylene ether, or liquid crystal polymer.

6. The multilayered substrate according to claim 1, further comprising:
   a first ground conductor; wherein
   the first insulating layer is between the signal conductor and the first ground conductor in a lamination direction.

7. The multilayered substrate according to claim 1, further comprising:
   a ground conductor; wherein
   the second insulating layer is between the signal conductor and the ground conductor in a lamination direction.

8. The multilayered substrate according to claim 1, wherein the first insulating layer is made of polyimide, modified-polyphenylene ether, or liquid crystal polymer.

9. The multilayered substrate according to claim 1, wherein the second and third insulating layers are bonding material layers.

10. The multilayered substrate according to claim 1, wherein the second insulating layer is a fluorine resin layer.

11. A multilayered substrate comprising:
    a plurality of laminated insulating layers including a first insulating layer, a second insulating layer, and a third insulating layer; and
    a transmission line; wherein the first insulating layer includes a first surface and a second surface that are opposite to each other;
    a signal conductor of the transmission line is provided on the first surface of the first insulating layer;
    the second insulating layer is in contact with the first surface of the first insulating layer;
    the third insulating layer is in contact with the second surface of the first insulating layer;
    a dielectric loss of the second insulating layer is lower than a dielectric loss of the third insulating layer;
    a degree of close contact between the first insulating layer and the third insulating layer is higher than a degree of close contact between the first insulating layer and the second insulating layer;
    a material of each of the first insulating layer, the second insulating layer, and the third insulating layer is different from one another;
    a boundary surface between the first insulating layer and the second insulating layer is closer to a center in a lamination direction than is a boundary surface between the first insulating layer and the third insulating layer; and
    the third insulating layer is a prepreg layer made of polyimide or liquid crystal polymer.

12. A multilayered substrate comprising:
a plurality of laminated insulating layers including a first insulating layer, a second insulating layer, a third insulating layer, a fourth insulating layer, and a fifth insulating layer; and
a transmission line; wherein the first insulating layer includes a first surface and a second surface that are opposite to each other;
a signal conductor of the transmission line is provided on the first surface of the first insulating layer;
the second insulating layer is in contact with the first surface of the first insulating layer;
the third insulating layer is in contact with the second surface of the first insulating layer;
a dielectric loss of the second insulating layer is lower than a dielectric loss of the third insulating layer;
a degree of close contact between the first insulating layer and the third insulating layer is higher than a degree of close contact between the first insulating layer and the second insulating layer;
a material of each of the first insulating layer, the second insulating layer, and the third insulating layer is different from one another;
a boundary surface between the first insulating layer and the second insulating layer is closer to a center in a lamination direction than is a boundary surface between the first insulating layer and the third insulating layer;
the fourth insulating layer is in contact with a surface of the second insulating layer opposite to a surface with which the first insulating layer is in contact;
the fifth insulating layer is in contact with a surface of the third insulating layer opposite to a surface with which the first insulating layer is in contact;
a boundary surface between the second insulating layer and the fourth insulating layer is closer to the center in the lamination direction than is a boundary surface between the first insulating layer and the third insulating layer;
the degree of close contact between the first insulating layer and the third insulating layer is higher than a degree of close contact between the second insulating layer and the fourth insulating layer; and
the fourth and fifth insulating layers are made of polyimide, modified-polyphenylene ether, or liquid crystal polymer.

* * * * *